United States Patent
Nakayama et al.

(10) Patent No.: US 6,981,727 B2
(45) Date of Patent: Jan. 3, 2006

(54) DIODE-TYPE NANOTWEEZERS AND NANOMANIPULATOR DEVICE USING THE SAME

(75) Inventors: Yoshikazu Nakayama, 9-404, 14-2, Korigaoka 1-chome, Hirakata-city, Osaka (JP) 573-0084; Akio Harada, Osaka (JP)

(73) Assignees: Daiken Chemical Co., Ltd., Osaka (JP); Yoshikazu Nakayama, Osaka (JP)

( * ) Notice: Subject to any disclaimer, the term of this patent is extended or adjusted under 35 U.S.C. 154(b) by 13 days.

(21) Appl. No.: 10/356,279

(22) Filed: Jan. 31, 2003

(65) Prior Publication Data

US 2004/0004364 A1   Jan. 8, 2004

(30) Foreign Application Priority Data

Jan. 31, 2002   (JP)   ............................. 2002-023969

(51) Int. Cl.
  *B25J 15/12*   (2006.01)
  *B25J 7/00*   (2006.01)
(52) U.S. Cl. ...................... 294/99.1; 294/86.4; 901/16; 901/36
(58) Field of Classification Search ............... 294/99.1, 294/1.1, 86.4, 902; 901/30, 31, 36, 39, 16; 977/DIG. 1
See application file for complete search history.

(56) References Cited

U.S. PATENT DOCUMENTS

| | | | | |
|---|---|---|---|---|
| 4,666,198 A | * | 5/1987 | Heiserman | 294/86.4 |
| 5,046,773 A | * | 9/1991 | Modesitt | 294/100 |
| 5,172,950 A | * | 12/1992 | Benecke | 294/86.4 |
| 5,722,989 A | * | 3/1998 | Fitch et al. | 606/205 |
| 5,770,856 A | * | 6/1998 | Fillard et al. | 250/234 |
| 6,252,226 B1 | * | 6/2001 | Kley | 250/306 |
| 6,325,909 B1 | * | 12/2001 | Li et al. | 205/106 |
| 6,513,213 B1 | * | 2/2003 | Muramatsu et al. | 29/25.35 |
| 6,668,652 B2 | * | 12/2003 | Nakayama et al. | 73/580 |
| 6,669,256 B2 | * | 12/2003 | Nakayama et al. | 294/99.1 |
| 6,703,615 B2 | * | 3/2004 | Nakayama et al. | 73/105 |
| 6,743,408 B2 | * | 6/2004 | Lieber et al. | 977/DIG. 1 |
| 6,802,549 B2 | * | 10/2004 | Nakayama et al. | 294/99.1 |
| 6,805,390 B2 | * | 10/2004 | Nakayama et al. | 294/99.1 |
| 2002/0061662 A1 | * | 5/2002 | Boggild | 438/800 |
| 2003/0098488 A1 | * | 5/2003 | O'Keeffe et al. | 257/401 |
| 2004/0043219 A1 | * | 3/2004 | Ito et al. | 428/408 |

* cited by examiner

*Primary Examiner*—Eileen D. Lillis
*Assistant Examiner*—Paul T. Chin
(74) *Attorney, Agent, or Firm*—Koda & Androlia

(57) ABSTRACT

Diode-type nanotweezers including a first arm and a second arm that project from a holder and are opened and closed by an electrostatic force so as to hold a nanosubstance. The first arm is formed by a gate nanotube fastened at its base end to the holder, and its tip end protrudes from the holder. The second arm is formed by a nanotube diode fastened at its two base ends to the holder and have a diode characteristic portion at its tip end. Diode current and diode voltage applied between the base ends of the arms shows a non-linear diode characteristic such as varistor and rectification. When a gate voltage is applied between the gate nanotube and the nanotube diode, the arms are controlled and a grip strength for a nanosubstance held by the arms is detected by changes in the gate voltage or the diode current.

7 Claims, 13 Drawing Sheets

DIODE-TYPE NANOTWEEZERS AND NANOMANIPULATOR DEVICE USING THE SAME

BACKGROUND OF THE INVENTION

1. Field of the Invention

The present invention relates to nanotweezers that hold and release a substance of nanosize (hereinafter called "nanosubstance") and also relates to nanotweezers enabling the optimum control of holding and releasing of nanosubstance by detecting a distance (interval) of at least two arms formed from nanotube that hold the nanosubstance through voltage and current, and further relates to a nanomanipulator device manufactures nanostructures such as nanosize parts and nanomolecular device by carrying the nanosubstance with the nanotweezers.

2. Prior Art

As for technology in recent years, it is oriented toward the minimum area more and more. For example, the development of the progressive manufacturing technology in nano-area is requested like the manufacture of the new bio-related functional material due to accumulation of cell and protein, and the manufacture of the new material related to the light and electronic information and the nanosize parts.

In order to build such a nanostructures, a development of nanotweezers that hold and release nanosubstances is requested, and a development of a nanomanipulator device is requested to hold, carry and release the nanosubstances.

First of all, the first archetype of nanotweezers was announced on "Science" by Philip Kim and Charles M. Lieber on Dec. 10, 1999. The nanotweezers are manufactured by pulling a glass tube until its tip end diameter becomes 100 nm and fixing two carbon nanotubes on the tip end. In such nanotweezers, by applying DC voltage to two carbon nanotubes, the positive and negative static electricities are generated at the tip ends of the carbon nanotubes, and the tip ends of the carbon nanotubes open and close due to the electrostatic attractive force.

However, the base body of this nanotweezers was very fragile because it was the glass tube which was made its tip end sharp by the elongation process, and there was a danger that the carbon nanotubes dropped off from the glass tube because the technology fixing the carbon nanotube strongly on the tip end of the glass tube was not established yet. And, the use as a nanotweezers was restricted because the technology carrying the glass tube freely was not established too.

In order to improve these faults, the inventors of the present application paid attention to the cantilever used for the atomic force microscope (AFM) and the drive control device of the cantilever. Then, through the Japanese Patent Application Laid-Open (Kokai) No. 2001-252900, the technology was developed which fastens two carbon nanotubes on the protruding portion of the cantilever for AFM strongly and hence it was developed the nanotweezers whose the tip ends of the carbon nanotubes can be opened and closed by applying the electrostatic voltage to the two carbon nanotubes. At the same time, by using the drive control device of the cantilever, it was developed the nanomanipulator device that can carry the nanotweezers freely with a nanoscale precision.

Furthermore, the inventors of the present application invented nanotweezers formed by three and more carbon nanotubes provided on the protruding portion of a cantilever as disclosed in the Japanese Patent Laid-Open (Kokai) No. 2000-404006, and the nanotweezers succeeded in holding and carrying various types of nanosubstance such as a spherical nanosubstance and a bar-like nanosubstance by opening and closing the tip ends of three and more carbon nanotubes due to the electrostatic force.

The nanotweezers can be also called nano-robot that can operate nanosubstances freely. When thinking with the macro-robot having the size of a human being, for example in the case of holding a glass cup, it should be just necessary that the glass cup is held by the grip strength controlled to some degree that the glass is not broken. As for the nano-robot as well, the same condition for this grip strength control is requested naturally.

In order to carry and control nanosubstances with the nanotweezers, it is necessary firstly to detect whether the nanotweezers hold nanosubstance first, and secondly to detect how much grip strength it has to hold the nanosubstance.

That reason is because there is the possibility that the nanosubstance deforms structurally when the grip strength grows excessively large. Such a control technology of the grip strength has not been developed so far.

SUMMARY OF THE INVENTION

Accordingly, one object of the present invention is to provide nanotweezers that can detect whether it holds the nanosubstance and detect the magnitude of the grip strength that holds the nanosubstance.

Another object of the present invention is to develop a nanomanipulator that operates nanosubstances by using nanotweezers.

The above object is accomplished by a unique structure for diode-type nanotweezers that comprise a first arm and a second arm that are formed so as to project from a holder and are freely opened and closed by an electrostatic force so as to hold a nanosubstance, wherein the first arm is formed by a gate nanotube which is fastened at its base end portion to the holder and its tip end portion protrudes from the holder, and the second arm is formed by a nanotube diode which is fastened at its two base end portions to the holder and has a diode characteristic portion at the tip end portion.

In the above nanotweezers, the interaction of the diode characteristics for the electrostatic attractive force between the gate nanotube and the nanotube diode is used; and it finds whether it holds the nanosubstance, and also electrostatic nanotweezers that can detect the size of the grip strength for holding the nanosubstance is obtained.

In the above structure, the nanotube diode is formed by folding one nanotube into two nanotube fragments so that both ends thereof are fastened, as the base end portions, to the holder and a tip end thereof which is a folded portion forms the diode characteristic portion that has diode characteristics.

By way of folding a single nanotube, a construction of the very original nanotube diode that has the diode characteristics is obtained.

Furthermore, in the above structure, the nanotube diode is formed by fastening a base end portion of each one of two nanotubes to the holder, and tip end portions of the two nanotubes contact each other so as to form a contact portion which makes the diode characteristic portion that has diode characteristics.

In other words, the present invention is completed based upon a new acknowledgement that the contact portion has the diode characteristics with a structure that the tip ends of two nanotubes are brought into a light contact with each other. A variety of revealing styles of diode characteristics is shown by the present invention.

Still further, in the present invention, the nanotube diode is formed by fastening a base end portion of each one of two nanotubes to the holder, and a middle nanotube is installed between tip end portions of the two nanotubes so that the tip end portions are in contact with each other so as to form a contact portion which forms the diode characteristic portion that has diode characteristics.

With this structure, the present invention realizes the strengthening of the diode characteristics by installing a middle or a third nanotube between the tip ends of two nanotubes in contact state. Thus, the present invention provides a diode-type nanotweezers that can hold the nanosubstance and also measure the grip strength easily.

In addition, in the present invention, the nanotube diode is formed by fastening a base end portion of each one of two nanotubes to the holder, and a middle nanotube is installed between tip end portions of the two nanotubes so that the tip end portions are electrically not in contact with each other by a carbon material filled in between so as to form an electrically insulated portion which makes the diode characteristic portion that has diode characteristics.

When the tip ends of two nanotubes and the middle nanotube are held to be in the insulation condition each other by the carbon accumulating material, the diode characteristics is further improved. By this invention, the holding of nanosubstance and the measurement of the grip strength are ensured, thus upgrading the operation and control of the nanotweezers.

Furthermore, in the present invention, a gate voltage for generating an electrostatic force is applied between the gate nanotube and the nanotube diode so that the nanotweezers hold the nanosubstance by way of controlling the gate voltage, and a grip strength applied on the nanosubstance is detected via the gate voltage.

In this structure, the grip strength of the arms is measured through detecting the gate voltage. By way of comparing the gate voltage with a limit gate voltage that holds the nanosubstance just before dropping the nanosubstance, it is possible to measure the grip strength precisely from the excess portion of the gate voltage; and in combination with the diode current, a more accurate grip strength control is accomplished.

In addition, in the present invention, the gate voltage for generating electrostatic force is applied between the gate nanotube and the nanotube diode while applying a diode voltage between the base end portions of the nanotube diode, thus controlling a diode current which flows through the nanotube diode, and a grip strength for holding the nanosubstance by the arms is detected via the diode current.

Two important phenomena for this nanotweezers are discovered by the inventors. One is that the diode current rises rapidly at the moment that the nanotweezers hold the nanosubstance, and the other is that an increase straight line of the diode current breaks before and after the nanosubstance is held by the nanotweezers. By using these phenomena, holding of a nanosubstance by the tweezers and a control of the grip strength of the tweezers are accomplished by measuring the diode current.

The present invention further provides a nanomanipulator device that comprises: the diode-type nanotweezers described above; a nanotweezers control circuit for controlling the gate voltage, the diode voltage and the diode current applied to the diode-type nanotweezers; and a carry control circuit for carrying the diode-type nanotweezers in XYZ directions.

This nanomanipulator device has a nano-robot function by a combination of diode-type nanotweezers that can control the grip strength for nanosubstances and a control circuit for voltages and currents. By the use of this nano-robot, manufacture of various nanostructures can be accomplished.

DETAILED DESCRIPTION OF THE INVENTION

Embodiments of the nanotweezers of the present invention and the nanomanipulator that uses the nanotweezers will be described in detailed below with reference to the accompanying drawings.

Figure 1:
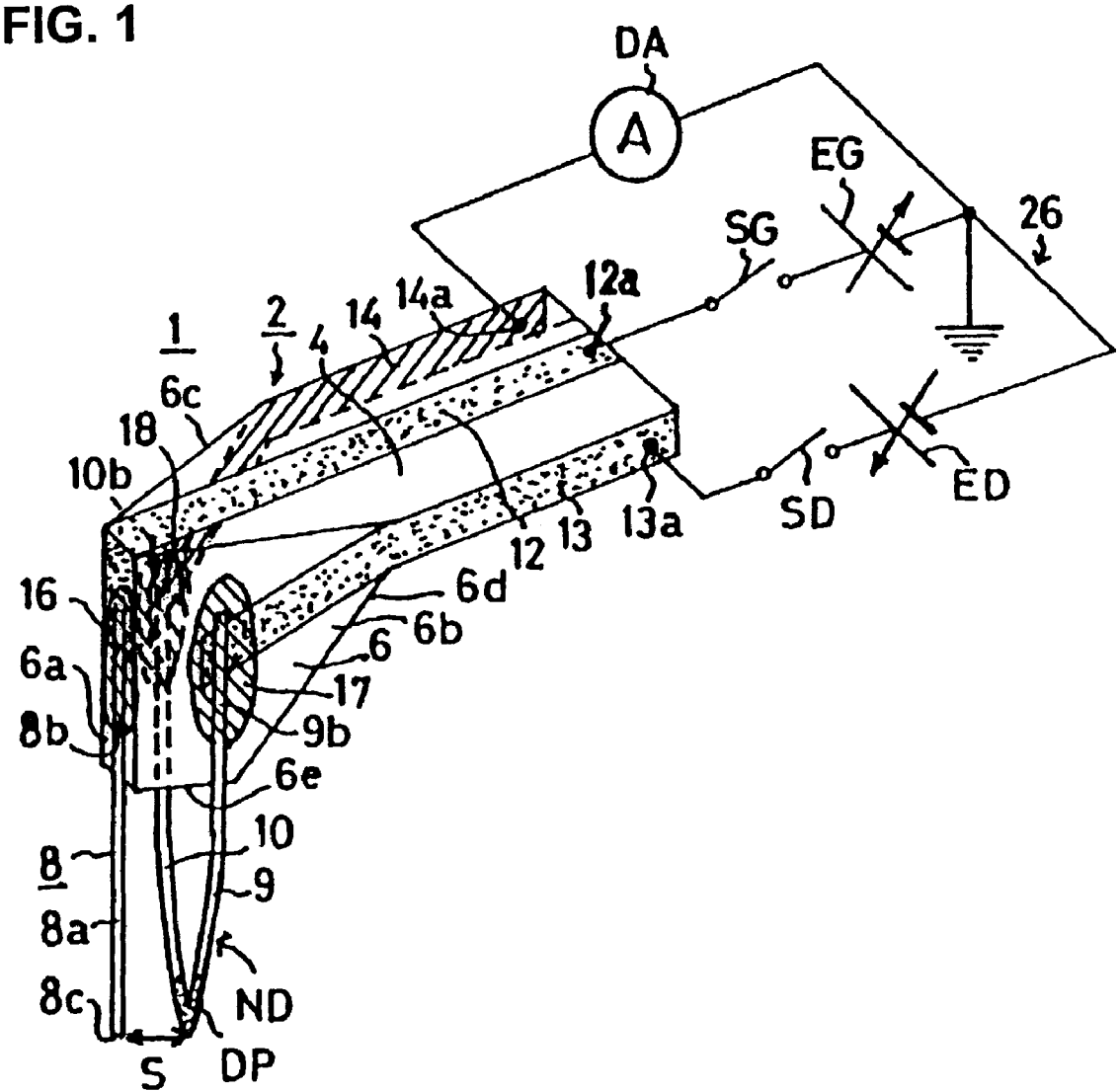
FIG. 1 is a schematic perspective view of one embodiment of the diode-type nanotweezers according to the present invention.

FIG. 1 is a schematic perspective view of the embodiment of the diode-type nanotweezers of the present invention. The diode-type nanotweezers 1 are comprised of two arms constructed from the nanotubes fastened on the front end of a holder.

Though the protruding portion 6 of a cantilever 2 for AFM is used as an example of the holder in this embodiment, other structures can be used. Here, the term "AFM" is an abbreviation of Atomic Force Microscope.

The cantilever 2 is comprised of a cantilever portion 4 and a protruding portion 6 protruded from the tip end of the cantilever portion 4. Though the protruding portion 6 can be formed by various shapes, the outer shape in this embodiment is formed by a front end surface 6a, side surfaces 6b and 6c, a rear end surface 6d and a protruding end 6e. A lead electrode 12 is formed on the cantilever portion 4 and on the front end surface 6a, and lead electrodes 13 and 14 are formed on the side surfaces 6b and 6c that extend from both side surfaces of the cantilever portion 4.

In the diode-type nanotweezers 1, a gate nanotube 8 or a first arm and a nanotube diode ND or a second arm are formed under the protruding portion 6. First, the base end portion 8b of the gate nanotube 8 which is a carbon nanotube is arranged to touch the front end portion 6a so that it can continue electrically with the lead electrode 12, and the base end portion 8b is fastened with a coating film 16.

In this embodiment, the nanotube diode ND is formed by folding one carbon nanotube, and is called the nanotube diode of type A. Diode nanotubes 9 and 10 are both legs of the nanotube diode ND formed by this folding, and their base end portions 9b and 10b are arranged to touch the side surface 6b and 6c, so that the base end portions 9b and 10b can continue electrically to the lead electrodes 13 and 14, and they are fastened with coating films 17 and 18.

Since the carbon nanotube is folded at the middle, the folded tip end portion is arranged so as to protrude downwardly.

In this folded tip end portion, the nature of usual carbon nanotube changes so as to show the electric insulation, and this folded tip end portion becomes the diode characteristic portion DP that has the diode characteristics. In this diode characteristic portion DP, the diode current $I_D$ flows by applying the diode voltage $V_D$, and the structure of this $I_D$-$V_D$ characteristics is similar to usual diodes of the electronic element. As for the details, it is explained in FIG. 5.

The nanotube diode ND which is the second arm and the gate nanotube 8 which is the first arm form the operation part of the nanotweezers. The space between the tip end 8c and the diode characteristic portion DP becomes an arm interval S, and holding and releasing of the nanosubstances are done by increasing and decreasing of the arm interval S.

A nanotweezers control circuit 26 is formed at the back of the diode-type nanotweezers 1. This nanotweezers control circuit 26 is composed by a gate electric power source EG, a diode electric power source ED, a gate switch SG, a diode switch SD and a diode ammeter DA. This circuit is connected to the lead electrodes 12, 13 and 14 through the contact points 12a, 13a and 14a.

Figure 2:
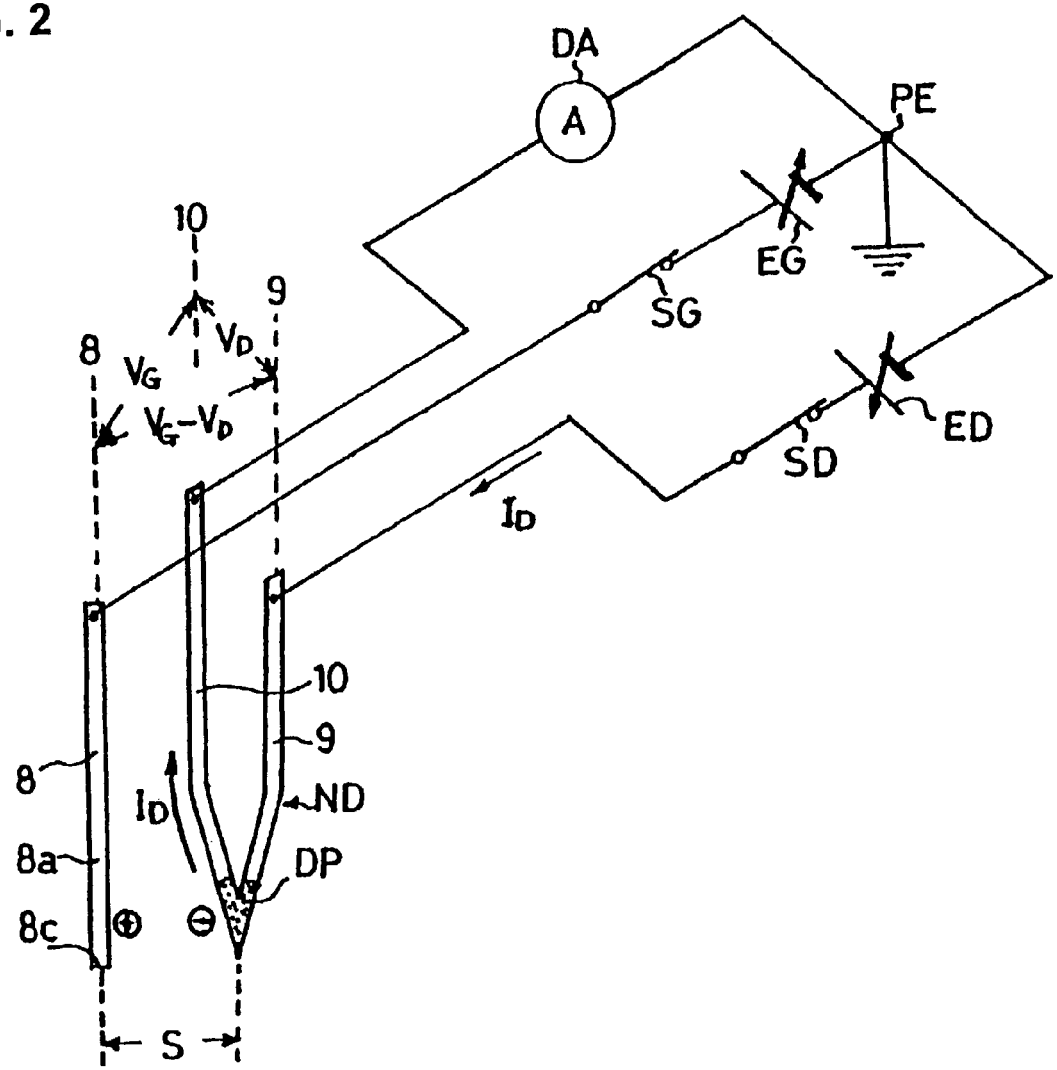
FIG. 2 is a schematic view of the circuit for the diode-type nanotweezers of FIG. 1.

FIG. 2 is the circuit schematic view of the diode-type nanotweezers shown in FIG. 1. When a diode switch SD is closed, a diode voltage $V_D$ is applied for the nanotube diode, and a diode current $I_D$ flows in the direction of an arrow.

At this time, the diode nanotube 10 becomes earth, and the electric potential of the diode nanotube 9 is set up to $V_D$.

Moreover, when the gate switch SG is closed, the electric potential of the point PE becomes earth by the gate electric power source EG, and the electric potential of the gate nanotube 8 is set up to the gate voltage $V_G$. By this gate voltage $V_G$, the positive charge (+) is electrostatically led to the tip end portion 8a of the gate nanotube 8, and at the same time the negative charge (−) is also led to the neighborhood of the diode characteristic portion DP.

Since the point PE is set up at earth, the electric potential of the diode nanotube 10 is equal to zero, that of the diode nanotube 9 is $V_D$, and that of the gate nanotube 8 is $V_G$−$V_D$. Therefore, the difference of electric potential between the nanotubes becomes $V_D$ in the nanotubes 9 and 10, $V_G$ in the nanotubes 8 and 10 and $V_G$−$V_D$ in the nanotubes 8 and 9.

Since it is required that the diode current $I_D$ flows in arrow direction and at the same time the negative charge is electrostatically induced in the diode characteristic portion DP, the gate voltage $V_G$ must be set up greater than the diode voltage $V_D$. In other words, the condition $V_G$>$V_D$ becomes necessary.

Explaining more in detail, the opening and closing of the arm interval S is adjusted due to the electrostatic attractive force between the positive and negative charges electrostatically induced by the gate voltage $V_G$, and it is desirable that this adjustment for opening and closing is not influenced by the diode voltage $V_D$.

In order to satisfy this condition, it is requested that the gate voltage $V_G$ is larger enough than the diode voltage $V_D$, and in other words it is desirable that $V_G$>>$V_D$ is satisfied.

Figure 5:
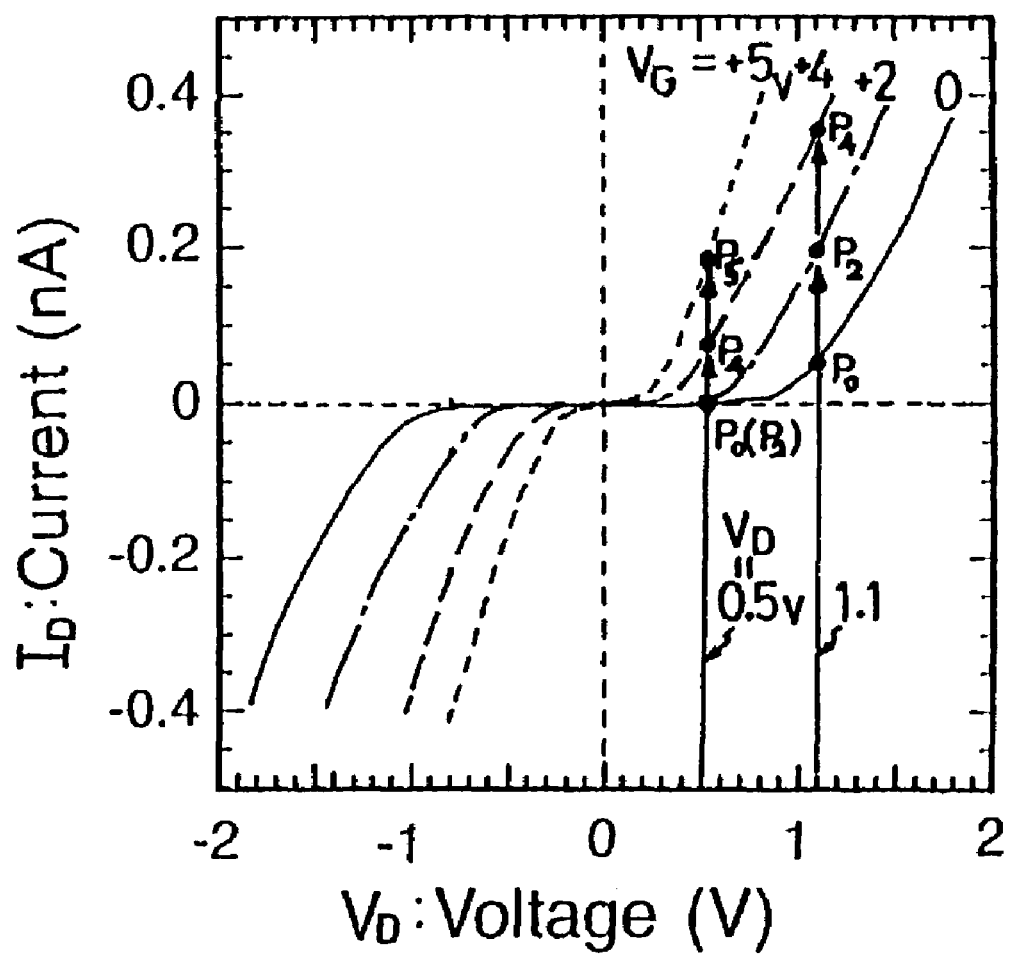
FIG. 5 is a diode characteristic chart that shows the relation between the diode current and the diode voltage for the gate voltage.

As described above, the diode characteristics in the relation of current and voltage ($I_D$-$V_D$) comes into being in the diode characteristic portion DP. As shown in FIG. 5, its relation illustrates a nonlinear curve that the diode current $I_D$ rapidly increases with increasing of the diode voltage $V_D$. This relation can be called varister characteristics from the meaning that the electric resistance changes. Moreover in the case that the current flows out rapidly from zero when the diode voltage $V_D$ reaches the critical value $V_{D\ C}$, this relation can be called the rectification characteristics. These nonlinear characteristics are called the diode characteristics in this invention.

Since the tip end 8c of the gate nanotube 8 approaches the diode characteristic portion DP when the gate voltage $V_G$ is applied, the electric field acting on the diode characteristic portion DP changes, and then the diode current $I_D$ changes, too.

In other words, it is understood that the $I_D$-$V_D$ relation also changes when the gate voltage $V_G$ changes. That is to say, if the gate voltage $V_G$ is decided, the $I_D$-$V_D$ characteristic is determined uniquely, too.

It can be explained quantum-mechanically with Coulomb brockade that this diode current $I_D$ changes by the gate voltage $V_G$. When the gate voltage $V_G$ increases, the electrons are electrostatically induced to the diode characteristic portion DP. This means that the diode current $I_D$ increases. Because the suitable energy is necessary to induce electrostatically one electron, the electrons are quantum-mechanically induced one by one by the step-like increasing of the gate voltage. Therefore, since one electron cannot be induced by increasing of voltage within one step, the Coulomb brockade comes into being in that meaning.

Figure 3:
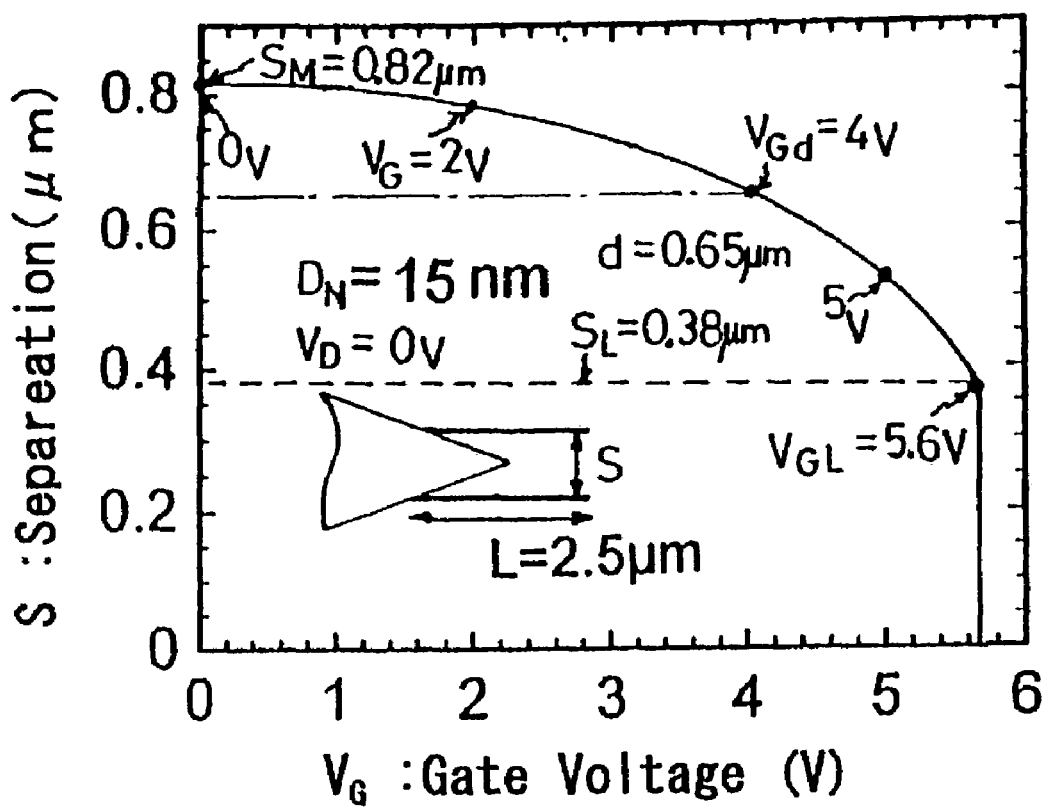
FIG. 3 shows a related curve between the gate voltage $V_G$ and the arm interval S when the diode voltage $V_D$ is not applied.

FIG. 3 is a related curve between the gate voltage $V_G$ and the arm interval S when the diode voltage $V_D$ is not applied. A general tendency of the related curve is explained because this related curve changes for every concrete composition of diode-type nanotweezers.

In this diode-type nanotweezers 1, the cross-sectional diameter DN of the gate nanotube 8 is 15 nm, and the length L of the gate nanotube 8 and the nanotube diode ND from the protruding portion 6 is 2.5 $\mu$m. The arm interval S becomes the largest at $V_G$=0(V), and the maximum interval $S_M$ is 0.82 $\mu$m.

When the gate voltage $V_G$ increases, the gate nanotube 8 mainly approaches the nanotube diode ND by the electrostatic attractive force, so that the gate nanotube inclines to the nanotube diode ND.

It can be easily understood that the flexibility (deflectivity) of the gate nanotube 8 composed by one carbon nanotube is higher than that of the nanotube diode ND folded one nanotube into two parts.

As the gate voltage $V_G$ increases such as $V_G$=0V, 2V, 4V and 5V, the arm interval S gradually becomes small. For example, what was $S_M$=0.82 μm at $V_G$=0V becomes small like S=0.65 μm at $V_G$=4V. At the moment that it reached the limit gate voltage $V_{GL}$=5.6V, the tip end 8c of the gate nanotube 8 touches the diode characteristic portion DP.

In the intermediate region, the electrostatic attractive force and the deflection elastic force of the carbon nanotube are pertinently balanced. However, when the limit gate voltage $V_{GL}$ becomes 5.6V, its balance collapses rapidly and at the moment that the electrostatic attractive force gets a little larger than the deflection elastic force, the tip end 8c of the gate nanotube 8 is absorbed to the diode characteristic portion DP. In other words, the limit arm interval $S_L$ is 0.38 μm at the limit gate voltage $V_{GL}$=5.6V, and the arm interval S becomes S= 0 in the gate voltage of $V_G$>5.6V.

Figure 4:
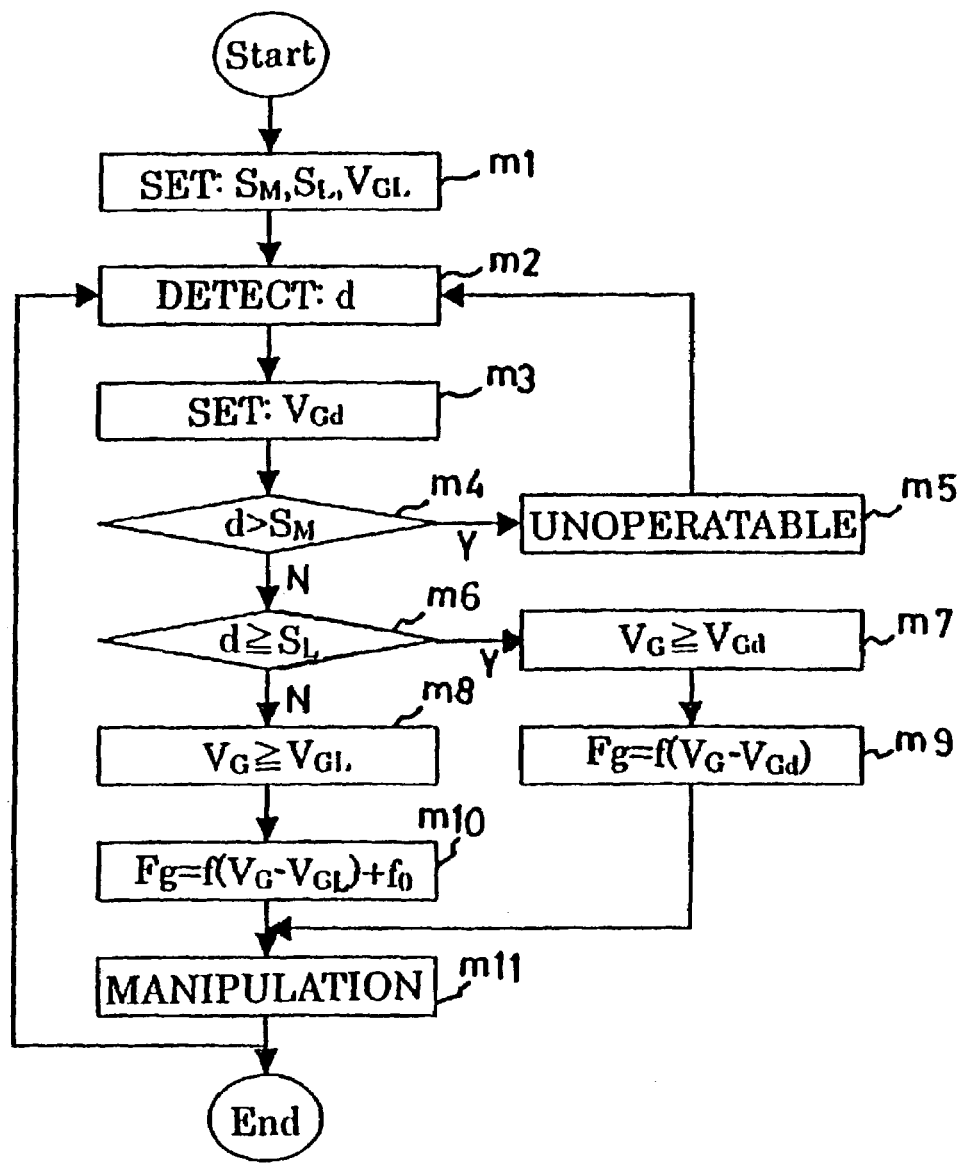
FIG. 4 is a flow diagram for controlling the diode-type nanotweezers while detecting the grip strength on nanosubstances by using the gate voltage.

FIG. 4 is a simple flow diagram for controlling the diode-type nanotweezers with the detecting function of the grip strength for nanosubstance by using a gate voltage. This flow diagram is based upon that the size d of the nanosubstance is measured through AFM-operating using the diode-type nanotweezers and then the nanotweezers are controlled according to the size.

As seen from the numerical values in FIG. 3, when the size d of nanosubstance exceeds the maximum interval $S_M$=0.82 μm, it is judged that holding is impossible. In the range of 0.82 μm ($S_M$)≧d≧0.38 μm ($S_L$), the gate voltage $V_{Gd}$ (called the corresponding gate voltage) which gives the arm interval S equal to d is calculated from the curve shown in FIG. 3. After holding the nanosubstance with-out applying of the gate voltage, when the gate voltage $V_G$ is increased to $V_{Gd}$, the nanosubstance is held in a state that the grip strength is equal to zero.

When $V_G$ is increased more than $V_{Gd}$, the arm interval cannot become narrow, but the nanosubstance is set to be held by the grip strength equal to the voltage difference $V_G$-$V_{Gd}$. Therefore, the grip strength $F_g$ is detected as a function of $V_G$-$V_{Gd}$.

In the case of d<0.38 μm ($S_L$), when the gate voltage $V_G$ is set up in the limit gate voltage $V_{GL}$, the gate nanotube 8 closes spontaneously and the nanosubstance is held.

If the nanosubstance does not exist, the arms perfectly close each other. However, such a situation is not taken into consideration in this simple flow diagram. When the gate voltage $V_G$ is increased more than the limit gate voltage $V_{GL}$ to enlarge the grip strength, the grip strength increases though the arm interval cannot get narrow more than d. This grip strength $F_g$ is detected as a function of the voltage difference $V_G$-$V_{GL}$ in this simple flow.

Next, the flow explained numerically as described above is explained by using a simple flowchart. The maximum interval $S_M$, the limit interval $S_L$ and the limit gate voltage $V_{GL}$ of this diode-type nanotweezers are initialized by the step m1.

Next, AFM operation is done by using the tip end 8c of the gate nanotube 8 of this nanotweezers as a needle, and the size d of the nanosubstance on the sample is measured (step m2).

The corresponding gate voltage $V_{Gd}$ equal to this size d is calculated from the curve data of FIG. 3 (step m3). For example, it becomes $V_{Gd}$=4V for d=0.65 μm (=650 nm). When the size d is larger than the maximum interval $S_M$ (step m4), it is judged that the operation is impossible (step m5) because the diode-type nanotweezers cannot hold the nanosubstance, and then the process returns to step m2, so that the size measurement of the next nanosubstance is done.

In the case that the size d is less than the maximum interval $S_M$ and beyond the limit interval $S_L$ (step m6), the nanosubstance is held at the state of $V_G$=0V and further the nanosubstance is held at the additional state of the grip strength by setting up the gate voltage $V_G$ beyond the corresponding gate voltage $V_{Gd}$ (step m7).

This grip strength $F_g$ is measured (step m9) as a function of the excess quantity $V_G$-$V_{Gd}$ of the gate voltage. The grip strength can be adjusted by setting variably the gate voltage $V_G$.

When the size d is smaller than the limit interval $S_L$, the nanosubstance cannot be held as far as the gate voltage $V_G$ is not set up beyond the limit voltage $V_{GL}$ (step m8). At this moment, the gate nanotube 8 closes to the size d of the nanosubstance spontaneously and instantaneously, and the grip strength $F_g$ can be detected the voltage difference $V_G$-$V_{GL}$ (step m10). Accordingly, when the nanosubstance is held by the grip strength of some magnitude, the nanosubstance does not drop from the diode-type nanotweezers.

Once the diode-type nanotweezers hold the nanosubstance, the process shifts to the usual nanomanipulation (step m11). In other words, the nanotweezers are raised together with the nanosubstance, and then is carried to a prearranged destination position. After that, the nanotweezers are lowered, and then the arms are completely opened by setting up the gate voltage $V_G$ to zero, so that the nanotweezers release the nanosubstance on the sample. By repeating these operations, the nanosubstances are selected from the position of raw material and arranged in the destination position, so that the nanostructures can be built in accordance with the draft.

Next, the use of diode current is studied to detect automatically the moment that the nanotweezers hold the nanosubstance and to measure automatically the grip strength for the nanosubstance. This use of diode current improves the operatability and controllability by using the measurement of the gate voltage described above together.

FIG. 5 is a diode characteristic view showing the relation between the diode current and the diode voltage for the gate voltage. This characteristic curve is also explained as a thing that shows a general tendency, because it changes for every concrete composition of the diode-type nanotweezers.

When the gate voltage $V_G$ is zero, the static electricity is not induced in the arms composed by nanotubes at all. The relation between the diode current $I_D$ and the diode voltage $V_D$ for $V_G$=0 is drawn with a solid line. $I_D$ is zero in the range of 0≦$V_D$≦0.8, and $I_D$≧0 for $V_D$≧0.8 comes into being because the diode current begins to flow out from $V_D$= 0.8V. As for the negative territory of $V_D$, the relation is symmetrical about the origin. Such a nonlinear relation is generally called the rectification characteristics, but it is called the diode characteristics in the present invention.

When the gate voltage $V_G$ is applied, the positive charge is induced to the tip end 8a of the gate nanotube 8, and the negative charge is induced to the diode characteristic portion DP. The induction of the negative charge means the increase of the diode current $I_D$. For example, the $I_D$-$V_D$ characteristics shifts from the solid line upward as show with the chain line, because $I_D$ increases when $V_G$=+2V is applied. The relation of long broken line comes into being in case of $V_G$=+4V, and further the relation of short broken line is concluded in case of $V_G$=+5V.

In this characteristics, let us consider a change of the diode current $I_D$ when the gate voltage $V_G$ is increased under the condition that the diode voltage $V_D$ is held to be constant. The diode current $I_D$ increases P0→P2→P4 with the change of $V_G$=0V=2V→4V in the condition of $V_D$=1.1V. The diode current of $I_D$=0.05 nA is flowing even in the point P0 at which the gate voltage $V_G$ is not applied. In other words, the switch-like change of $I_D$ does not occur in $V_D$=1.1V.

On the other hand, the diode current $I_D$ increases as P0 (P2)→P4→P5 with the change of $V_G$=0V→2V→4V→5 V in the case of $V_D$=0.5V. The diode current $I_D$ at the points P0 and P2 is zero. Namely, it is understood that the diode current $I_D$ does not flow at $V_G$=0V and 2V, and can flow at $V_G$=4V and 5V. In other words, it becomes possible to use the switching characteristic that the current does not flow in $V_G$<2V and begins to flow in $V_G$>0.

This phenomenon shows the first utilization method of the diode current. The holding of the nanosubstance can be detected by described the switching characteristic that the diode current begins to flow rapidly and it gets possible to measure the grip strength of the nanotweezers for the nanosubstance from the value of the diode current.

For example, the AFM operation for the nanosubstance is done by the nanotweezers, and it is assumed that its size is d=0.65 μm (=650 nm). It can be calculated from S–$V_G$ characteristics shown in FIG. 3 that the corresponding gate voltage is $V_{Gd}$=4V.

That is to say, if 4V is applied as the gate voltage $V_G$, it means that the nanosubstance is held under the state that the grip strength is zero.

Next, from $I_D$-$V_D$ characteristics shown in FIG. 5, let us calculate $V_D$ that $I_D$ begins to flow from zero in $V_G$=4V. In other words, this calculation gives $V_D$ satisfying the critical condition that $I_D$ is almost zero in $V_G$<4V and begins to flow rapidly at $V_G$=4V. This $V_D$ is named a critical diode voltage and $V_D$=0.5V is calculated from FIG. 5.

Accordingly, under the condition that the diode voltage is fixed at $V_D$=0.5V for the nanosubstance of d=0.65 μm, the diode current $I_D$ is measured with increasing of the gate voltage $V_G$. It is shown that the diode-type nanotweezers hold the nanosubstance when $I_D$ begins to flow rapidly, and then $I_D$ increases by increasing the gate voltage $V_G$. Accordingly, the magnitude of the grip strength is derived as a function of $I_D$. The magnitude of $I_D$ is corresponding to the voltage difference $V_G$-$V_{Gd}$. The grip strength can be detected from this voltage difference $V_G$-$V_{Gd}$ and can be also detected from the diode current $I_D$.

In the case operating the nanosubstances of the same size, since their sizes d are the same, their critical diode voltages become the same, too. As a result, their grip strengths can be measured by detecting only the diode current $I_D$ in the same condition.

Figure 6:
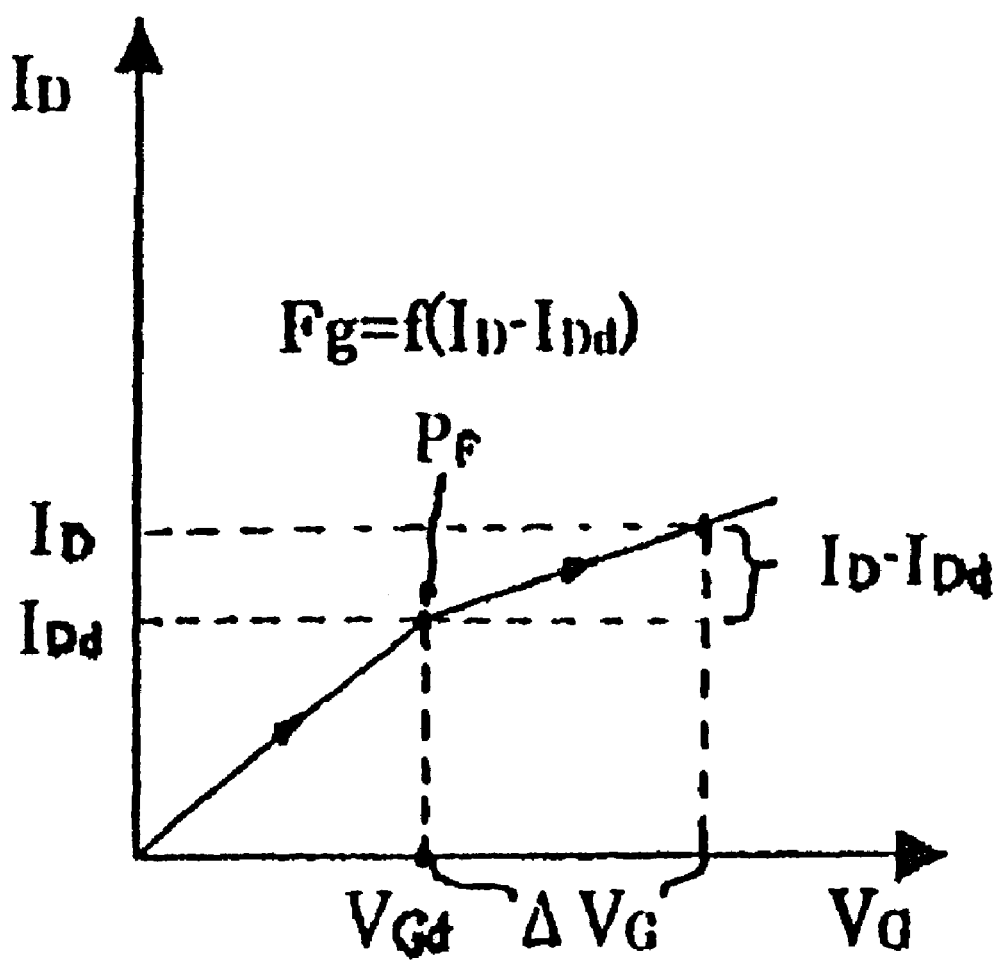
FIG. 6 is a diagram showing the relationship between the diode current and the gate voltage in the case to hold the nanosubstance larger than the limit interval $S_L$.
Figure 7:
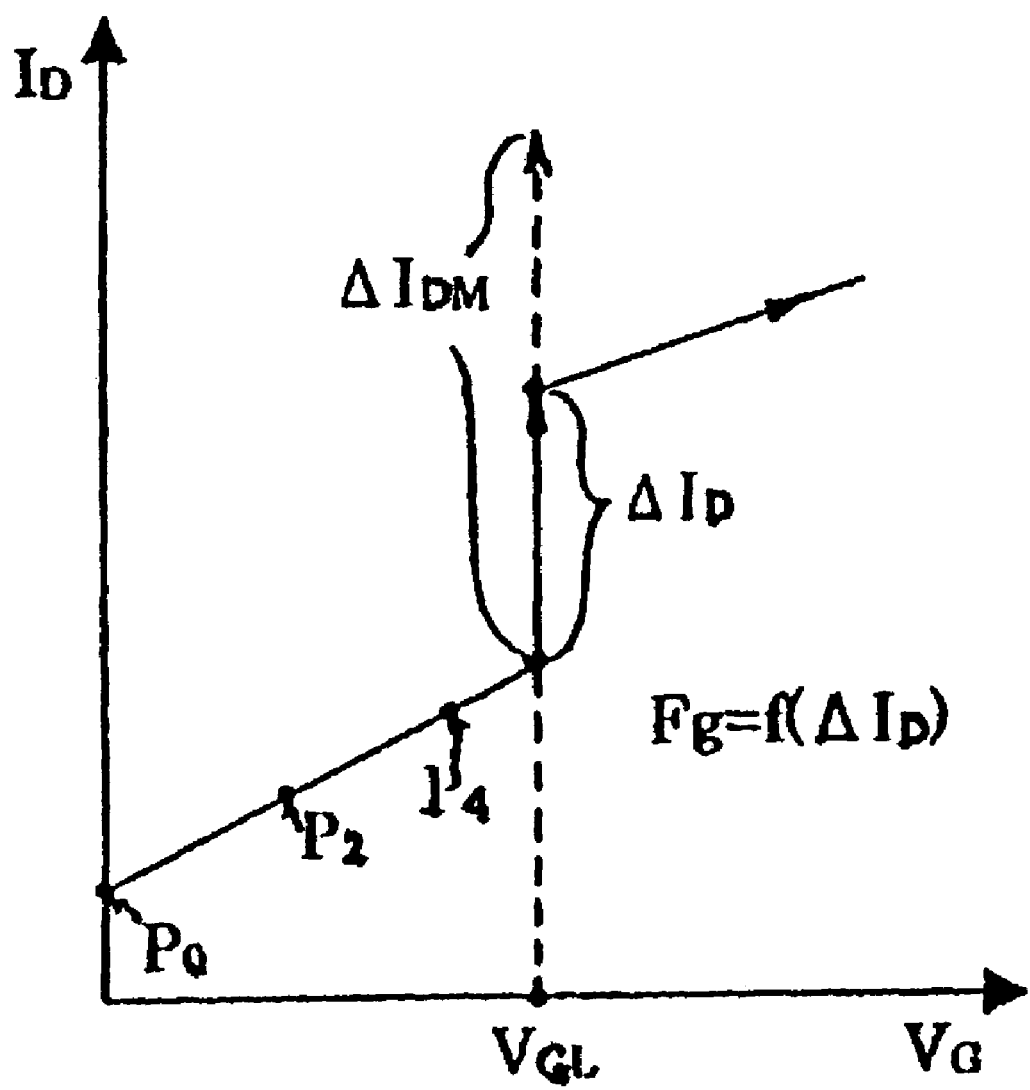
FIG. 7 is diagram showing the relationship between the diode current and the gate voltage in the case to hold the nanosubstance smaller than the limit interval $S_L$.

FIGS. 6 and 7 show the other detecting methods of the grip strength using the diode current. In both figures, the predetermined diode voltage $V_G$ is applied to the nanotube diode ND, and then it is assumed that the diode current $I_D$ flows.

FIG. 6 shows the relation curve diagram between the diode current and the gate voltage in the case that the nanosubstance larger than the limit interval $S_L$ is held. The diode current $I_D$ increases gradually, because the gate nanotube 8 approaches the nanotube diode ND when the gate voltage $V_G$ increases from zero gradually.

When the gate voltage reaches the corresponding gate voltage $V_{Gd}$, the gate nanotube 8 touches the nanosubstance and then never approach inside of the touching position. However, when the gate voltage $V_G$ is increased further in this state, the diode current $I_D$ also increases because the electrostatic induction strengthens much more. In this case, an increasing slope is small because there is no approach of the gate nanotube 8. Therefore, the diode current $I_D$ breaks on the right and left of the corresponding gate voltage $V_{Gd}$.

The holding of the nanosubstance can be detected from this breaking of the diode current $I_D$. Furthermore, when the gate voltage is increased by $\Delta V_G$ more than the corresponding gate voltage $V_{Gd}$, the grip strength increases for the nanosubstance. This grip strength $F_g$ can be detected as a function of the current difference $I_D$-$I_{Dd}$ or the excess gate voltage $\Delta V_{Gd}$.

FIG. 7 is a relation curve diagram between the diode current and the gate voltage in the case holding the nanosubstance smaller than the limit interval $S_L$.

Of course, since the predetermined diode voltage $V_G$ is applied to the nanotube diode ND, the diode current $I_D$ is flowing.

When the gate voltage $V_G$ is increased gradually, the diode current $I_D$ also increases. This relation copes with P0→P2→P4 of $V_D$=1.1V in FIG. 5. Therefore, as for FIG. 7 as well, it is considered that the diode current $I_D$ increases like P0→P2→P4.

Now, because the size d of the nanosubstance is smaller than the limit interval $S_L$, the gate nanotubes 8 close and hold the nanosubstance as soon as the gate voltage $V_G$ reaches the limit gate voltage $V_{GL}$, and hence the arm interval S becomes equal to the size d.

Since the gate nanotubes 8 close at the moment when the limit gate voltage $V_{GL}$ is applied, the diode current $I_D$ is also raised rapidly due to the sudden increase of the electrostatic induction, and then the increase quantity $\Delta I_D$ is detected. Therefore, the holding of the nanosubstance can be detected by measuring the increase quantity $\Delta I_D$ of the diode current $I_D$. The grip strength $F_g$ can be derived as the function of $\Delta I_D$, namely f ($\Delta I_D$).

If the nanosubstance is not held, the gate nanotube 8 touches the nanotube diode ND, and the circuit gets short electrically. Accordingly, the increase of the diode current $I_D$ reaches much larger the short increase quantity $\Delta I_{DM}$. From these phenomena, it can be judged that the nanosubstance is held for the case that the current increase $\Delta I_D$ does not reach $\Delta I_{DM}$ in increase quantity. On the other hand, it can be judged that the nanosubstance is not held and the circuit got short electrically for the case that the current increase $\Delta I_D$ increases rapidly to $\Delta I_{DM}$.

Figure 8:
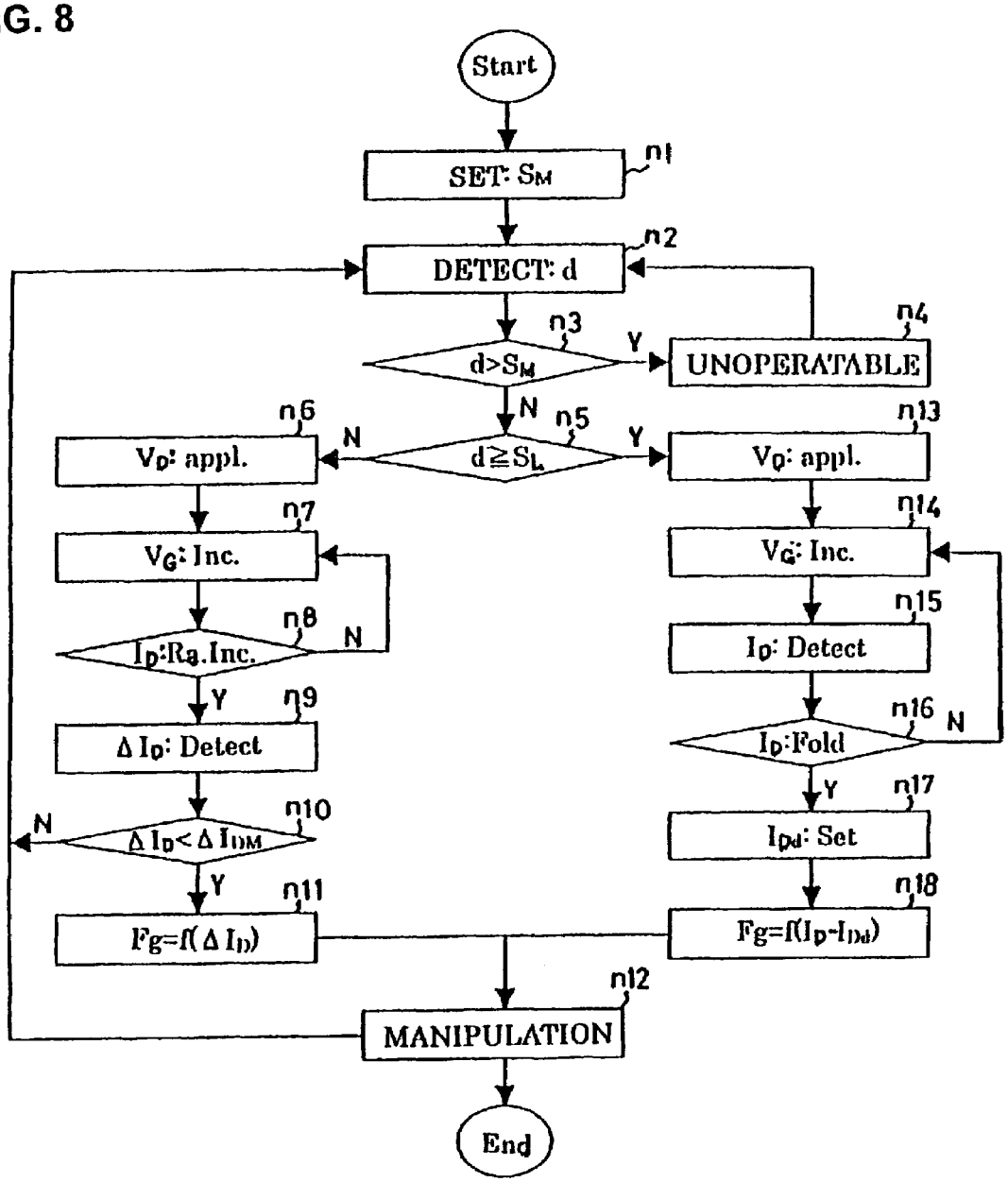
FIG. 8 is a simple flow diagram for controlling the diode-type nanotweezers while detecting the grip strength for the nanosubstance by the use of the diode current.

FIG. 8 is a simple flow diagram that controls the diode-type nanotweezers while detecting the grip strength for the nanosubstance by the use of diode current. In this process, firstly, the size d of the nanosubstance is measured by AFM operation of the diode-type nanotweezers, and secondly, the nanotweezers are controlled according to that size.

The maximum interval $S_M$ that is the characteristic value of the diode-type nanotweezers is initialized in step n1. Next, the gate nanotube 8 is used as the needle, and the size d is measured by AFM operation of the nanosubstance (step n2).

If the size d of the nanosubstance is larger than the maximum interval $S_M$ of the arm (step n3), the operation becomes impossible because the nanotweezers cannot hold the nanosubstance. The operation for that nanosubstance is ended, the process returns to step n2 again, and it goes into the size measurement of new nanosubstance.

If the size d satisfies d≦$S_M$, the size d is compared with the limit interval $S_L$ of the nanotweezers (step n5). When the size d is smaller than the limit interval $S_L$, the predetermined diode voltage $V_D$ is applied (step n6). The gate voltage $V_G$ under this condition is increased (step n7), and then if the diode current $I_D$ rises up rapidly is checked (step n8).

If the diode current $I_D$ does not rise rapidly, again the rapid rise of the diode current $I_D$ is checked by increasing the gate voltage $V_G$ more. This operation is repeated until the rapid rise of $I_D$ is detected. When the rapid rise of $I_D$ is detected, the increase quantity $\Delta I_D$ of the diode current $I_D$ is measured (step n9).

When the increase quantity $\Delta I_D$ of the diode current is smaller than the short increase quantity $\Delta I_{DM}$ (step n10), it is judged that the nanotweezers hold the nanosubstance. Subsequently, the grip strength $F_g$ for the nanosubstance is calculated due to $F_g = f(\Delta I_D)$ (step n11), and hence the nanosubstance is carried to the predetermined destination position (step n12). When $\Delta I_D$ is beyond $\Delta I_{DM}$, it means that the nanotweezers cannot hold the nanosubstance and the circuit is shortened, so that the process returns to step n2 to measure another nanosubstance.

When the size of the nanosubstance is beyond the limit interval $S_L$ (step n5), the predetermined diode voltage $V_D$ is applied (step n13). The diode current $I_D$ under this condition is measured with increasing of the gate voltage $V_G$ (step n14). Then, it is judged if the break occurred in the diode current $I_D$ (step n16), and then if there is no break, the process returns to step n14 again, and the above process is repeated.

If the break is confirmed in the diode current $I_D$, it means that the nanotweezers hold the nanosubstance. This diode current is called the corresponding diode current $I_{D\_d}$, and an internal setup (n17) is done. In the corresponding diode current $I_{D\_d}$, the nanosubstance is held under the condition just before falling off.

Furthermore, as if the gate voltage $V_G$ is increased much more, the nanotweezers do not closed any further because the gate nanotube 8 holds the nanosubstance. However, since the diode current $I_D$ can increase much more, the nanotweezers can hold the nanosubstance with the grip strength $F_g$ dependent upon $I_D - I_{Dd}$. As for this grip strength $F_g$, a function calculation (step n18) is done in form of $F_g = f(I_D - I_{Dd})$.

After that, the nanosubstance is carried to the destination position (step n12), and then after the process returns to step n2, these operation are repeated for new nanosubstance.

Figure 9:
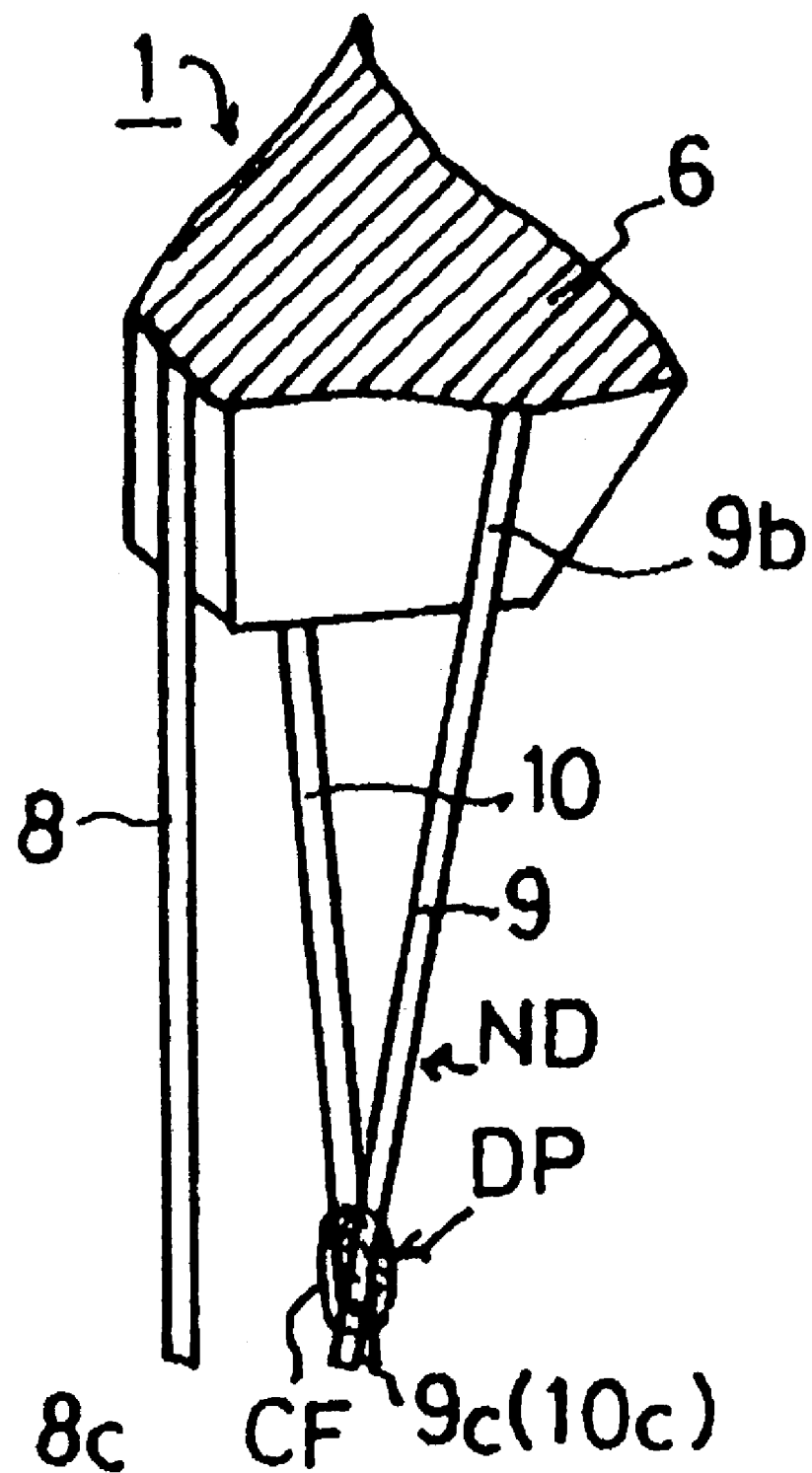
FIG. 9 is a perspective view showing the main portion of the diode-type nanotweezers that include the nanotube diode of type B.

FIG. 9 is a strategic perspective view of the diode-type nanotweezers that include the nanotube diode of type B. The gate nanotube 8 becoming the first arm is protruded on one side of the protruding portion 6 of the diode-type nanotweezers 1. The nanotube diode ND becoming the second arm is protruded on the other side of the protruding portion 6.

This nanotube diode ND is composed by two diode nanotubes 9 and 10. The base end portions 9b and 10b of the diode nanotubes 9,10 are fastened on the side surface of the protruding portion 6 by the coating film, and their tip ends 9c, 10c contact each other. This contact state is fixed by surrounding the circumference with the accumulating material CF. This contact portion is the diode characteristic portion DP.

Figure 12:
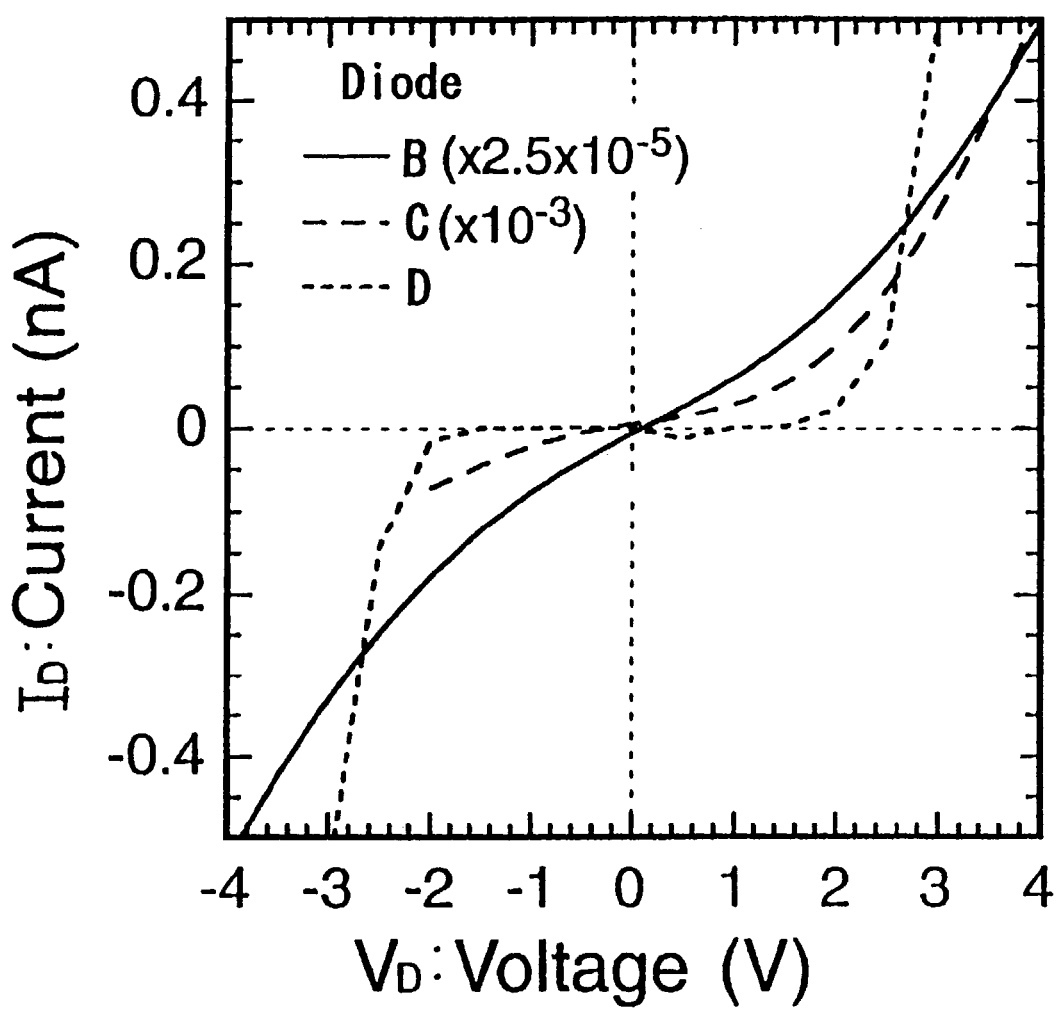
FIG. 12 is an $I_D$-$V_D$ characteristic diagram of three kinds of nanotube diode (B, C and D) shown in FIGS. 9 and 10 and 11.

As for the diode characteristic portion DP of this nanotube diode ND, the relation between the diode current $I_D$ and the diode voltage $V_D$ were measured, and the nonlinear relation was concluded as shown in a solid line of FIG. 12. Even in the case that nanotubes contact simply one another, such a nonlinear characteristic appears by the contact portion. This nonlinear relation has the center symmetry about the origin, and it is understood that it has the varistor characteristic from the nonlinear form. The diode characteristic of this invention is the concept containing such a varistor characteristic, too.

Figure 10:
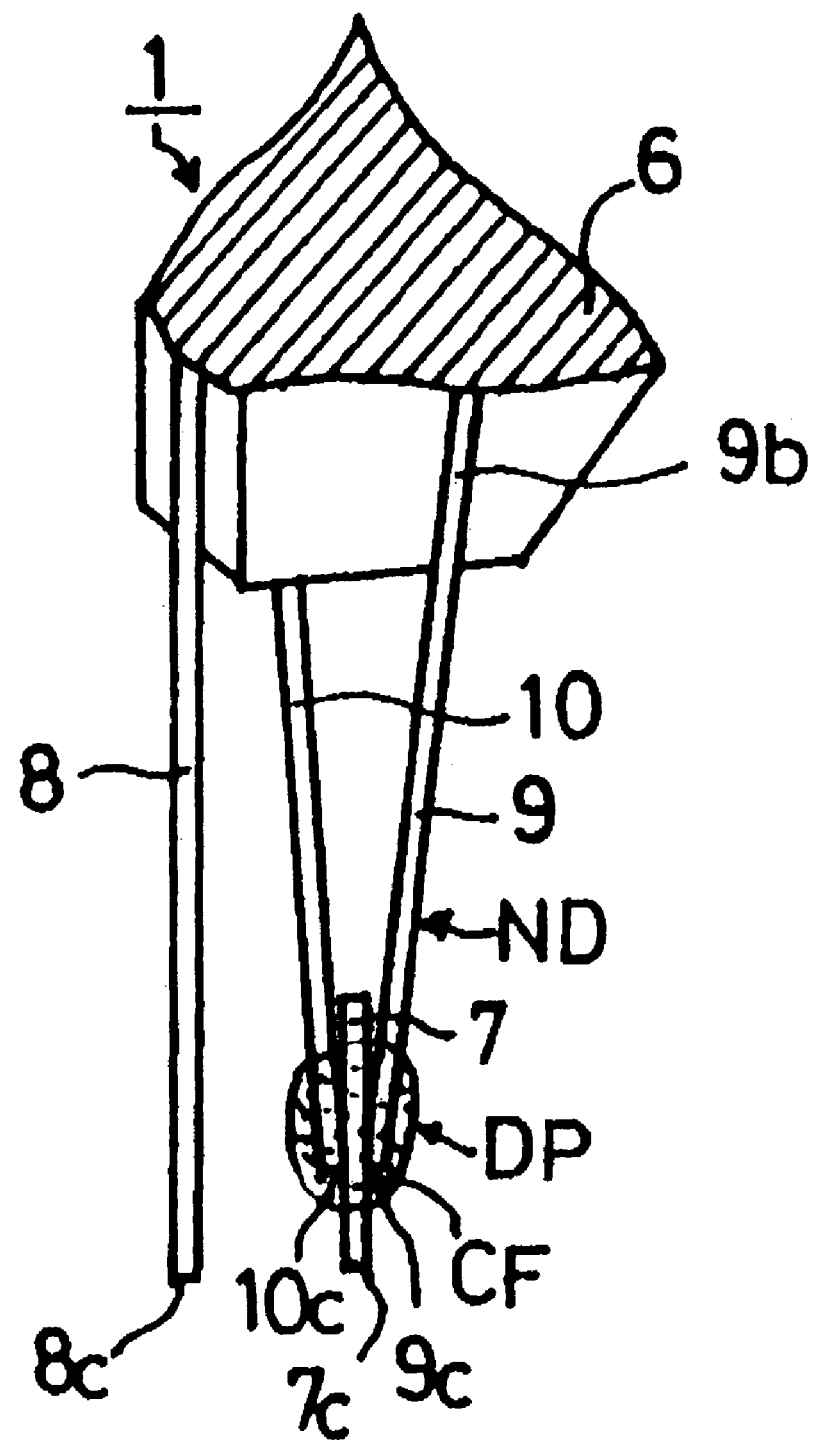
FIG. 10 is a perspective view showing the main portion of the diode-type nanotweezers that include the nanotube diode of type C.

FIG. 10 is a strategic perspective view of the diode-type nanotweezers that include the nanotube diode of type C. As well as the type B, the gate nanotube 8 becoming the first arm is protruded on one side of the protruding portion 6 of the diode-type nanotweezers 1. The nanotube diode ND becoming the second arm is protruded on the other side of the protruding portion 6.

The nanotube diode ND is composed by two diode nanotube 9 and 10, and the base end portions 9b and 10b are fastened on the side surface of the protruding portion 6 by the coating film. The short middle nanotube 7 is independently sandwiched between the tip ends 9c and 10c, and contacts with the tip ends 9c and 10c at two contacting points. This contact condition is fixed by surrounding its circumference with the accumulating material CF. The contact portion which has two contact points composes the diode characteristic portion DP of this invention. It is convenient to protrude the tip end 7c of the middle nanotube 7 from nanotubes 9 and 10 because this tip end 7c becomes the tip end of the second arm and can be used as the AFM needle.

When the relation between the diode current $I_D$ and the diode voltage $V_D$ were measured for this diode characteristic portion DP, it is found that nonlinear elations shown by long broken line of FIG. 12 is concluded. It is understood that the nonlinearity is enhanced by two contact points. Though the measurement on the negative side of the diode voltage $V_D$ is not sufficient, it is estimated that the center symmetry for the origin is almost concluded. Since the electric resistance changes nonlinearly from the strong nonlinearity, it is found that it has the strong varistor characteristic, too.

Figure 11:
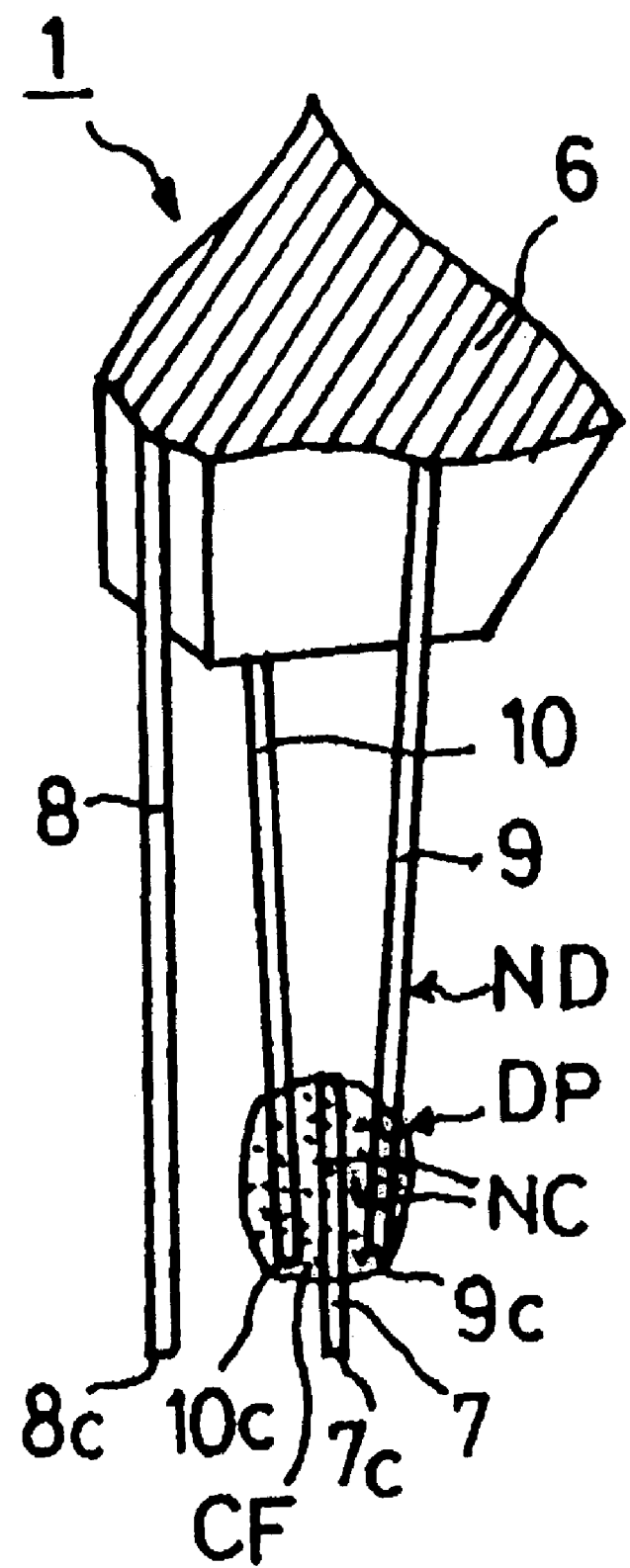
FIG. 11 is a perspective view showing the main portion of the diode-type nanotweezers that include the nanotube diode of type D.

FIG. 11 is a strategic perspective view of the diode-type nanotweezers that include the nanotube diode of type D. This type D has the composition that is almost the same as the type C, and the different point is that there are two non-contact portions NC instead of two contact points. In other words, it is held the state that the tip end 9c and 10c of the diode nanotubes 9 and 10 and the middle nanotube 7 approach one another but do not contact.

Namely, there is two non-contact portions NC in the type D instead of two contact points. This non-contact portion NC is formed by filling the insulative accumulating material CF to its circumference and its non-contact portions. The carbon accumulating material is used simply as the accumulating material CF common for type B, type C and type D. When an electron beam is irradiated to the required portion, the organic material existing in the electron microscope is dissociated by the electronic beam, and the dissociated material accumulates on the irradiated portion.

The region of these two non-contact portions NC composes the diode characteristic portion DP of type D. When the relation between the diode current $I_D$ and the diode voltage $V_D$ was measured for this diode characteristic portion DP, it was found that the nonlinear relation was concluded as shown in the short broken line of FIG. 12. The non-linearity becomes stronger because of existence of two non-contact portions NC, and it was found that there is the critical voltage of ±1.9V. This characteristic is the clearest diode characteristic.

The critical characteristic is defined by that the diode current $I_D$ grows rapidly large in the region of diode voltage $V_D$ beyond the critical voltage, and is called the switching characteristic or the rectification characteristic. Therefore, the diode current $I_D$ changes to on/off in the right and left of the critical voltage, and the rectification action is obtained, because the diode current is cut off in the diode voltage less than the critical voltage when the load resistance is connected to the output side. Like this, the semiconductor characteristic is obtained in type D.

FIG. 12 is an $I_D$-$V_D$ characteristic diagram of three kinds of nanotube diode (B, C and D) shown in FIGS. 9 and 10 and 11. The diode characteristics of type B, type C and type D are shown with real line, long broken line and short broken line, respectively.

In the present invention, four kinds of type A, type B, type C and type D are illustrated as embodiments of the nanotube diode, but the diode characteristic is not limited to these embodiments. All combinations of nanotube having the non-linear diode characteristic between the diode current $I_D$ and the diode voltage $V_D$ are contained in the nanotube diode of the present invention.

Figure 13:
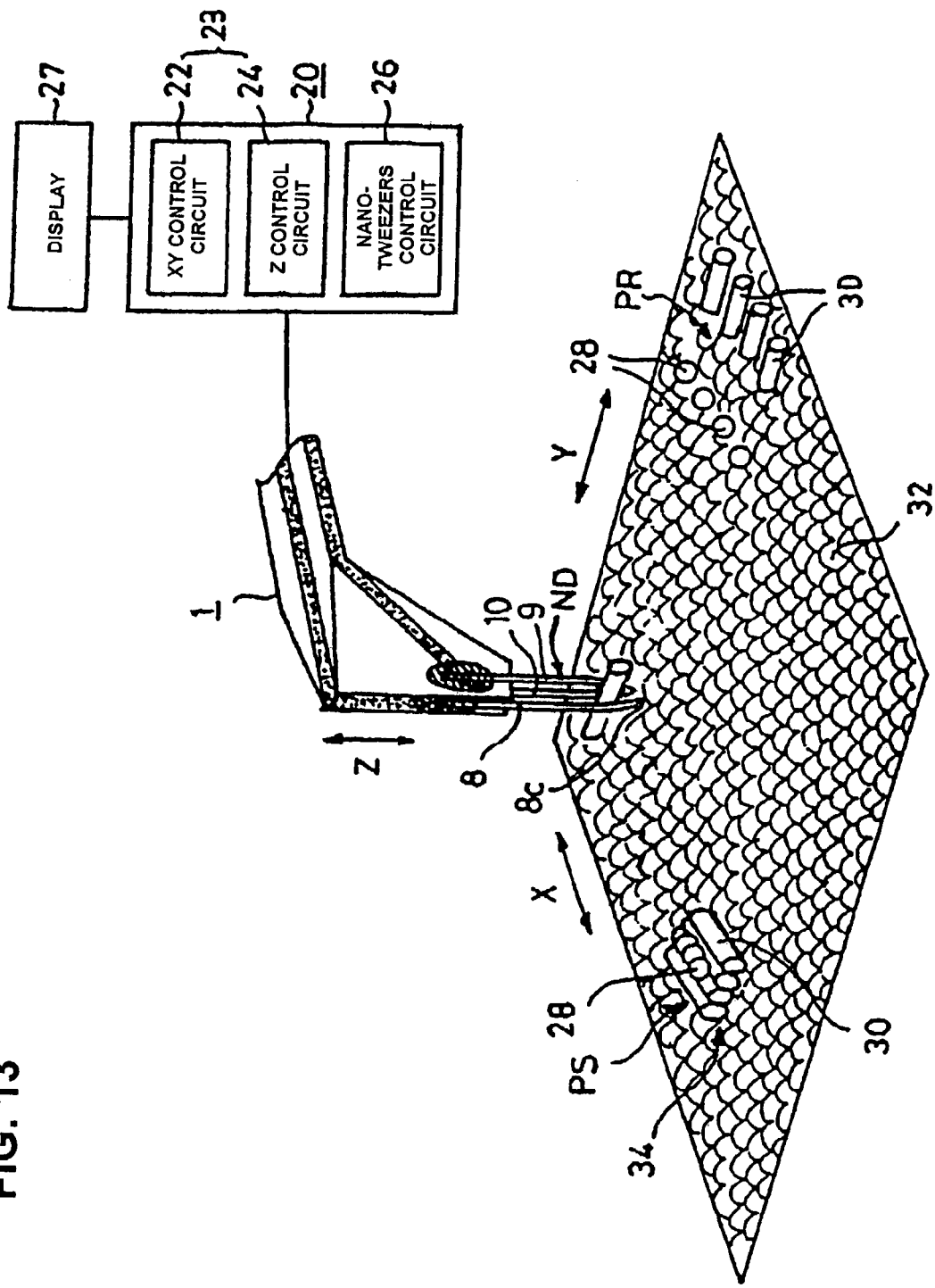
FIG. 13 is an explanatory diagram of the nanomanipulator of the present invention that uses the diode-type nanotweezers.

FIG. 13 is an explanatory diagram of the nanomanipulator that uses the diode-type nanotweezers of the present invention. On the surface of a sample 32, there are a raw material position and a destination position PS. At the raw material position, the spherical nanosubstance 28, the bar-like nanosubstance 30 and so on are accumulated; and at the destination position PS, the nanostructure 34 is formed by these raw materials.

In order to carry the nanosubstances from the raw material position to the destination position, the control circuit 20 that controls the diode-type nanotweezers 1 is set up. This control circuit 20 is composed by a carry control circuit 23 which carries the nanotweezers 1 in the XYZ directions and the nanotweezers control circuit 26 which controls opening and closing of the nanotweezers 1 for holding and releasing of nanosubstances. And, the carry control circuit 23 consists of an XY control circuit 22 which controls the drive of the X direction and the Y direction, and a Z control circuit 24 which control the drive in the Z direction. The states of the carrying control and the nanotweezers control are shown on the display 27.

Next, the operations of the nanomanipulator using this diode-type nanotweezers 1 are used are explained simply. First, the nanotweezers 1 are raised to the raw material position PR in the Z direction, and the AFM needle is set up by closing the gate nanotube 8 (first arm) and the nanotube diode ND (second arm). After the nanotweezers 1 are lowered in the Z direction, AFM scanning around the raw material position is operated by the carry control circuit 23. Now, when the material to be held is the bar-like nanosubstance 30, the position and size of that material are measured.

The measured size is inputted in the nanotweezers control circuit 26, and the nanotweezers nip the bar-like nanosubstance (target) by opening the arms. By measuring the diode current flowing rapidly when the arms were closed, it is detected that both arms held the bar-like nanosubstance. Moreover, by detecting the diode current, the bar-like nanosubstance is held with the predetermined grip strength generated by closing of arms.

The nanotweezers 1 that hold the nanosubstance is raised in the Z direction, and is carried to the destination position PS by the carry control circuit 23. Then, when the nanotweezers 1 are lowered in the Z direction and reaches the special place of the nanostructures 34, the bar-like nanosubstance 30 is released by opening the arms. After that, AFM scanning is operated for the nanostructures 34 by closing the arms, and it is confirmed whether the bar-like nanosubstance 30 is arranged properly.

After confirming, the nanotweezers 1 are raised, and returns to the raw material position PR by the carry control circuit 23. Again, the next nanosubstance is chosen and the above operations are repeated. Many nanosubstances are arranged in accordance with the draft, and the nanostructures 34 is constructed due to this repetition. There are various nanostructures 34 in the new materials relating to the light and electronic information, and the new bio-relating functional materials due to accumulation of nanosize parts, cells and proteins.

The present invention is not limited to the above-described embodiments. It goes without saying that various modifications and design alterations, etc. that involve no departure from the technical spirit of the present invention are included in the technical scope of the present invention.

According to the present invention, the gate nanotube is used for the first arm and the nanotube diode is used for the second arm. When the nanosubstance is held between both arms, the holding of the nanosubstance and the grip strength for the nanosubstance can be detected by reaction of the diode characteristic portion formed in the nanotube diode. The operation of nanotweezers is accomplished by variably adjusting the grip strength for the nanosubstance.

According to the present invention, the nanotube diode can be constructed only by folding one nanotube into two parts and fastening both ends on the holder as the base end portions. Since the diode characteristic portion is formed at the tip folding portion, it is possible to provide diode-type nanotweezers that are easy to assemble and the diode characteristic portion is assuredly formed.

According to the present invention, the diode characteristic portion can be constructed by fastening the base end portions of two nanotubes on the holder and by providing the tip end portions to be in contact with each other. The diode-type nanotweezers with the durability can be obtained by protecting the surroundings of the contact portion with the accumulating material and so on.

Also, according to the present invention, the diode characteristic portion is constructed by fastening the base end portions of two nanotubes to the holder and sandwiching an independent middle (third) nanotube between the tip end portions of two nanotubes under contact state each other. By protecting the surrounding of the contact portions with the accumulating material and so on, the response of the diode characteristic portion is enhanced, and the high durability is added. When the tip end of the middle nanotube is protruded, the tip end of the nanotube diode becomes sharp, and then the resolving power can be elevated in the case of not only nanotweezers operation but also AFM operation.

Furthermore, according to the present invention, the diode characteristic portion can be constructed by fastening the base end portions of two nanotubes to the holder and sandwiching the independent middle nanotube between the tip end portions of two nanotubes under non-contact state each other. The diode characteristic is remarkably improved, and the durability is also improved by protecting the surrounding of the non-contact portions with the accumulating material and so on. When the tip end of the middle nanotube is protruded, the resolving power can be enhanced in the case of not only nanotweezers operation but also AFM operation.

In addition, according to the present invention, when the gate voltage generating the electrostatic attractive force is applied between the gate nanotube and the nanotube diode, the nanosubstance is held by being gripped by way of controlling the gate voltage. It is possible to provide diode-type nanotweezers that can detect the grip strength for the nanosubstance through the gate voltage.

When the gate voltage is compared with the limit gate voltage that allows holding of the nanosubstance under the condition just before falling, the grip strength can be detected precisely by an excess amount of the gate voltage, and then a more accurate grip strength control can be accomplished in combination with the diode current. Further, it can be prevented that the nanosubstance is added the excessive grip strength, and it becomes possible that the nanotweezers operation is controlled not to transform the nanosubstance structurally.

According to the present invention, in the state that the diode voltage is applied between the base end portions of the nanotube diode, the diode current is controlled by applying the gate voltage for the electrostatic attractive force between the gate nanotube and the nanotube diode. Thus, diode-type nanotweezers that can detect the grip strength for holding the nanosubstance while measuring the diode current can be provided. By way of using the phenomenon that the diode current rapidly increases at the moment of holding of a nanosubstance and the phenomenon that the increasing function of the diode current is broken before and after the nanosubstance is held, a free control of the holding and grip strength for a nanosubstance can be accomplished by measuring the diode current.

Furthermore, the present invention provides a nanomanipulator device that comprises: a diode-type nanotweezers; a nanotweezers control circuit for controlling the gate voltage, the diode voltage and the diode current applied to the diode-type nanotweezers; and a carry control circuit for carrying the diode-type nanotweezers in XYZ directions.

This nanomanipulator device has a nano-robot function by a combination of diode-type nanotweezers that can control the grip strength for nanosubstances and a control circuit for voltages and currents. By the use of this nanorobot, manufacture of various nanostructures can be accomplished, thus contributing the progress of nanotechnology.

What is claimed is:

1. Diode-type nanotweezers comprising a first arm and a second arm that are formed so as to project from a holder and are freely opened and closed by an electrostatic force applied between tip end portions of said first and second arms so as to hold a nanosubstance, wherein said first arm is formed by a gate nanotube which is fastened at a base end portion thereof to said holder and a tip end portion thereof protrudes from said holder, said second arm is formed by a nanotube diode which is fastened at two base end portions thereof to said holder and has a diode characteristic portion at a tin end nortion thereof, and said nanotube diode is formed by folding one nanotube into two nanotube fragments so that both ends thereof are fastened, as said base end portions, to said holder and a tip end thereof which is a folded portion thereof forms said diode characteristic portion that has diode characteristics.

2. Diode-type nanotweezers comprising a first arm and a second arm that are formed so as to project from a holder and are freely opened and closed by an electrostatics force applied between tin end portions of said first and second arms so as to hold a nanosubstance, wherein said first arm is formed by a gate nanotube which is fastened at a base end portion thereof to said holder and a tip end portion thereof protrudes from said holder, said second arm is formed by a nanotube diode which is fastened at two base end portions thereof to said holder and has a diode characteristic portion at a tip end portion thereof, and said nanotube diode is formed by fastening a base end portion of each one of two nanotubes to said holder, and tip end portions of said two nanotubes contact each other so as to form a contact portion which is said diode characteristic portion that has diode characteristics.

3. Diode-type nanotweezers comprising a first arm and a second arm that are formed so as to project from a holder and are freely opened and closed by an electrostatic force applied between tip end portions of said first and second arms so as to hold a nanosubstance, wherein said first arm is formed by a gate nanotube which is fastened at a base end portion thereof to said holder and a tip end portion thereof protrudes from said holder, said second arm is formed by a nanotube diode which is fastened at two base end portions thereof to said holder and has a diode characteristic portion at a tip end portion thereof, and said nanotube diode is formed by fastening a base end portion of each one of two nanotubes to said holder, and a middle nanotube is installed between tip end portions of said two nanotubes so that said tip end portions are in contact with each other so as to form a contact portion which is said diode characteristic portion that has diode characteristics.

4. Diode-type nanotweezers comprising a first arm and a second arm that are formed so as to project from a holder and are freely opened and closed by an electrostatic force applied between tip end portions of said first and second arms so as to hold a nonosubstance, wherein said first arm is formed by a gate nanotube which is fastened at a base end portion thereof to said holder and a tip end portion thereof protrudes from said holder, said second arm is formed by a nanotube diode which is fastened at two base end portions thereof to said holder and has a diode characteristic portion at a tip end portion thereof, and said nanotube diode is formed by fastening a base end portion of each one of two nanotubes to said holder, and a middle nanotube is installed between tip end portions of said two nanotubes so that said tip end portions are not in contact with each other with a carbon material in between so as to form a non-contact portion which is said diode characteristic portion that has diode characteristics.

5. Diode-type nanotweezers comprising a first arm and a second arm that are formed so as to project from a holder and are freely onened and closed by an electrostatic force applied between tip end portions of said first and second arms so as to hold a nanosubstance, wherein said first arm is formed by a gate nanotube which is fastened at a base end portion thereof to said holder and a tip end portion thereof protrudes from said holder, said second arm is formed by a nanotube diode which is fastened at two base end portions thereof to said holder and has a diode characteristic portion at a tip end portion thereof, and a gate voltage for generating an electrostatic force is applied between said gate nanotube and said nanotube diode so that said nanotweezers hold said nanosubstance by way of controlling said gate voltage, and a grip strength applied on said nanosubstance is detected via said gate voltage.

6. Diode-tipe nanotweezers comprising a first arm and a second arm that are formed so as to project from a holder and are freely opened and closed by an electrostatic force applied between tip end portions of said first and second arms so as to hold a nanosubstance, wherein said first arm is formed by a gate nanotube which is fastened at a base end portion thereof to said holder and a tip end portion thereof protrudes from said holder, said second arm is formed by a nanotube diode which is fastened at two base end portions thereof to said holder and has a diode characteristic portion at a tip end portion thereof, and a gate voltage for generating electrostatic force is applied between said gate nanotube and said nanotube diode while applying a diode voltage between said base end portions of said nanotube diode, thus controlling a diode current which flows through said nanotube diode, and a grip strength for holding said nanosubstanre by said arms is detected via said diode current.

7. A nanomanipulator device comprising:
   the diode-type nanotweezers according to claim 5 or 6,
   a nanotweezers control circuit for controlling a gate voltage, a diode voltage and a diode current applied to said diode-type nanotweezers, and
   a carry control circuit for carrying said diode-type nanotweezers in XYZ directions.

* * * * *